United States Patent [19]
Walton et al.

[11] Patent Number: 5,850,528
[45] Date of Patent: Dec. 15, 1998

[54] BUS TIMING PROTOCOL FOR A DATA STORAGE SYSTEM

[75] Inventors: John K. Walton, Hopedale; Eli Leshem, Brookline, both of Mass.

[73] Assignee: EMC Corporation, Hopkinton, Mass.

[21] Appl. No.: 701,862

[22] Filed: Aug. 23, 1996

[51] Int. Cl.[6] .................................................. G06F 13/16
[52] U.S. Cl. .......................... 395/287; 395/309; 395/881; 711/113; 711/114; 711/167; 711/168; 711/165
[58] Field of Search ..................................... 711/114, 167, 711/113, 168, 165; 395/280, 309, 287, 845, 848, 881

[56] References Cited

U.S. PATENT DOCUMENTS

| | | |
|---|---|---|
| 4,691,294 | 9/1987 | Humpleman .............................. 395/881 |
| 5,392,422 | 2/1995 | Hoel et al. ................................ 395/881 |
| 5,590,369 | 12/1996 | Burgess et al. .......................... 395/881 |

*Primary Examiner*—Reginald G. Bragdon
*Attorney, Agent, or Firm*—Fish & Richardson P.C.

[57] ABSTRACT

In an data storage system having a bank of disk drives an addressable memory has a buffer memory coupled to a bus, a random access memory coupled to the buffer memory, an internal clock, and a logic network. The logic network is coupled to the bus and configured to transfer data among the buffer memory, the random access memory, and the bus in response to clock signals produced by the internal clock and clock pulses provided on the bus. The addressable memory is included in an interface and further includes a master memory unit and a slave memory unit.

10 Claims, 8 Drawing Sheets

5,850,528

BUS TIMING PROTOCOL FOR A DATA STORAGE SYSTEM

BACKGROUND OF THE INVENTION

This invention relates generally to data storage systems, and more particularly to data storage systems having redundancy arrangements to protect against total system failure in the event of a failure in a component or subassembly of the storage system.

As is known in the art, large mainframe computer systems require large capacity data storage systems. These large main frame computer systems generally includes data processors which perform many operations on data introduced to the computer system through peripherals including the data storage system. The results of these operations are output to peripherals, including the storage system.

One type of data storage system is a magnetic disk storage system. Here a bank of disk drives and the main frame computer system are coupled together through an interface. The interface includes CPU, or "front end", controllers and "back end" disk controllers. The interface operates the controllers in such a way that they are transparent to the computer. That is, data is stored in, and retrieved from, the bank of disk drives in such a way that the mainframe computer system merely thinks it is operating with one mainframe memory. One such system is described in U.S. Pat. No. 5,206,939, entitled "System and Method for Disk Mapping and Data Retrieval", inventors Moshe Yansi, Natan Vishlitzky, Bruno Altersu and Daniel Castel, issued Apr. 27, 1993, and assigned to the same assignee as the present invention.

As described in such U.S. Patent, the interface may also include, in addition to the CPU controllers and disk controllers, addressable cache memories. The cache memory is a semiconductor memory and is provided to rapidly store data from the main frame computer system before storage in the disk drives, and, on the other hand, store data from the disk drives prior to being sent to the main frame computer. The cache memory being a semiconductor memory, as distinguished from a magnetic memory as in the case of the disk drives, is much faster than the disk drives in reading and writing data.

The CPU controllers, disk controllers and cache memory are interconnected through a backplane printed circuit board. More particularly, disk controllers are mounted on disk controller printed circuit boards. CPU controllers are mounted on CPU controller printed circuit boards. And, cache memories are mounted on cache memory printed circuit boards. The disk controller, CPU controller and cache memory printed circuit boards plug into the backplane printed circuit board. In order to provide data integrity in case of a failure in a controller, the backplane printed circuit board has a pair of buses. One set the disk controllers is connected to one bus and another set of the disk controllers is connected to the other bus. Likewise, one set the CPU controllers is connected to one bus and another set of the CPU controllers is connected to the other bus. The cache memories are connected to both buses.

Thus, the use of two buses provides a degree of redundancy to protect against a total system failure in the event that the controllers, or disk drives connected to one bus fail.

In one system, the communication to the controllers and the cache memories is through a pair of bi-directional lines. Typically one bi-directional line is for data and the other bi-directional line is for control signals. As noted above, each controller is connected to only one of the buses and, therefore, only one pair of bi-directional lines are electrically connected to the controllers; however, because each one of the cache memories is connected to both buses, each cache memory has two pairs of bi-directional lines.

One such data storage system is an asynchronous system. In such system, when a controller wishes to read data from an addressed memory, the addressed memory places the data and a clock pulse on the bus. The data and the clock travel along the bus to the controller, the controller receives the data and clocks the data into the controller using the clock placed on the bus by the addressed memory. When the controller wishes to have data written into an addressed memory, the controller places the data on the bus and the addressed memory must strobe the data on the bus into itself. However, because the system is asynchronous, the addressed memory may not be ready to accept the data on the bus. Therefore, when addressed by the controller, the memory places a clock on the bus, the clock runs to the controller, the controller detects the clock sent by the addressed memory and places the data on the bus. The data runs back to the addressed memory, and then, after a predetermined round-trip time, the addressed memory clocks in the data. While the round-trip is a function of the distance between the controller and the addressed memory, the system is designed with the a predetermined round-trip time sufficient to account for the maximum expected round-trip time. Thus, in those cases where the controller/addressed memory pair are relative close together, time is lost in waiting for the maximum predetermined round-trip time before the addressed memory writes in the data on the bus.

SUMMARY OF THE INVENTION

In accordance with one feature of the invention, an addressable memory is provided having: a buffer memory adapted for coupling to a bus; a random access memory coupled to the buffer memory; an internal clock; and, a logic network, coupled to the bus and configured to transfer data among the buffer memory, the random access memory and the bus in response to clock signals produced by the internal clock and clock pulses provided on the bus.

With such an arrangement, improved data transfer to and from such memory is achieved.

In a preferred embodiment, the buffer memory includes a first-in/first out (FIFO).

In accordance with another feature of the invention, a data storage system is provided wherein a main frame computer section having main frame processors for processing data is coupled to a bank of disk drives through an interface. The interface includes: a bus; a controller; and, an addressable memory. The controller and addressable memories are interconnected through the bus. The addressable memory includes a master memory unit and a slave memory unit. Each one of the memory units includes: a buffer memory coupled to the bus; a random access memory coupled to the buffer memory; an internal clock; and, a logic network coupled to the bus and configured to transfer data among the buffer memory, the random access memory and the bus in response to clock signals produced by the internal clock and clock pulses provided on the bus.

In accordance with another feature of the invention, an addressable memory is provided having a master memory unit and a slave memory unit. The master memory unit and the slave memory unit have the same address as the addressable memory. A control unit is provided for producing control signals to enable data stored in the master memory unit to be read therefrom and transferred to the bus when such data is requested from the addressable memory and to enable data on the bus to be written into both the master memory unit and the slave memory unit when data on the bus is to be written into the addressable memory.

With such an arrangement, each addressable memory has redundancy and is operable in case either the master memory unit or the slave memory unit thereof fails.

In accordance with another feature of the invention, the control unit is adapted to: (i) during a normal mode, enable data produced on the bus to be written into both the master memory unit and the slave memory unit and data in only the master memory unit to be read therefrom when such data is to be transferred to the bus, and (ii) during a read/copy mode, enable data stored in the master memory unit to be read therefrom, transferred to the bus, and written from the bus into the slave memory unit.

With such an arrangement, data in the master memory unit may be copied to the slave memory unit during the read/copy mode without disrupting the operation of the system after a failed slave memory unit has been replaced.

In accordance with another feature of the invention, a plurality of addressable memories are interconnected through a bus. Each one of such addressable memories includes: (a) a random access memory; (b) an internal clock; (c) a buffer memory; and (d) a logic network. The logic network is configured to enable data on the bus to be written into the random access memory of one of the plurality of addressable memories in response to clock pulses produced on the bus during a period of time when data stored in the random access memory of another one of the addressable memories is transferred to the buffer memory thereof in response to clock signals produced by the internal clock thereof.

With such an arrangement, data to be read from the other one of the addressable memories can be pre-fetched from the random access memory thereof while data is written into the first-mentioned addressable memory. This pre-fetching frees the random access memory for other tasks requested by the system.

In accordance with still another feature of the invention, a data storage system is provided wherein a main frame computer section has main frame processors for processing data coupled to a bank of disk drives through an interface. The interface includes: (a) a bus; (b) a controller; and (c) an addressable memory. The controller and addressable memory are electrically interconnected through the bus. The addressable memory includes: (i) a random access memory; (ii) an internal clock; (iii) a buffer memory. The interface includes a control unit for producing control signals to enable data on the bus to be written into the buffer memory in response to the bus write clock pulses and to enable data to be transferred between the buffer memory and the random access memory in response to clock signals produced by the internal clock.

With such an arrangement, the controller provides data and bus write clock pulses on the bus, such data being written into the buffer memory of the addressed memory and later transferred to the random access memory thereof under control of clock pulses produced by the clock internal thereof.

In accordance with the still another feature of the invention, a data storage system is provided wherein a main frame computer section having main frame processors for processing data is coupled to a bank of disk drives through an interface. The interface includes disk controllers, central processor unit (CPU) controllers, and a cache memory electrically interconnected through a pair buses. Each cache memory includes a master memory unit and a slave memory unit. Each one of the pair of memory units includes a buffer memory, preferably a first-in/first out (FIFO) memory; a random access memory; an internal clock; and, a control network operated by the internal clock to transfer data among the buffer memory, the random access memory and the bus.

In accordance with still another feature of the invention, an addressable memory is provided adapted for coupling to a pair of buses. The addressable memory includes: a random access memory; a pair of control logic networks each one coupled to a corresponding one of the pair of buses for enabling data transfer between the random access memory and the one of the buses coupled thereto; and a pair of timer/logic units, each one thereof coupled to a corresponding one of the pair of control logic networks for measuring the time duration the one of the control logic networks coupled thereto enables data transfer between the random access memory and the one of the pair of buses coupled thereto and for disabling such data transfer when the measured time duration exceeds a predetermined maximum time duration.

In a preferred embodiment, when the measured time duration exceeds the predetermined maximum time duration, the timer/logic unit enables the other one of pair of control logic networks to enable data transfer between the random access memory and the bus coupled thereto.

In accordance with yet another feature of the invention, an addressable memory is provided, such memory being adapted for coupling to a bus. The addressable memory includes: a random access memory; a control logic network coupled to the bus for producing sequence of a row address signal and a column address signal for the random access memory in response to an address signal on the bus. The control logic generates a row parity bit from the row address signal and a column parity bit from the column address signal. An address driver feeds the sequence of the row address signal and the column address signal produced by the control logic network to the random access memory. The random access memory produces a parity bit from the row address fed thereto by the address driver and a parity bit from the column address fed thereto by the address driver. The row and column parity bits produced by the random access memory are fed to the control logic and are compared with the row and column parity bits, respectively, generated by the control logic. If the row parity bit generated by the control logic is different from the row parity bit generated by the random access memory or if the column parity bit generated by the control logic is different from the column parity bit generated by the random access memory, a fault in the transmission of the address to the random access memory via the address driver is detected.

BRIEF DESCRIPTION OF THE DRAWING

Referring now to the accompanying drawings.

DESCRIPTION OF THE PREFERRED EMBODIMENTS

Figure 1:
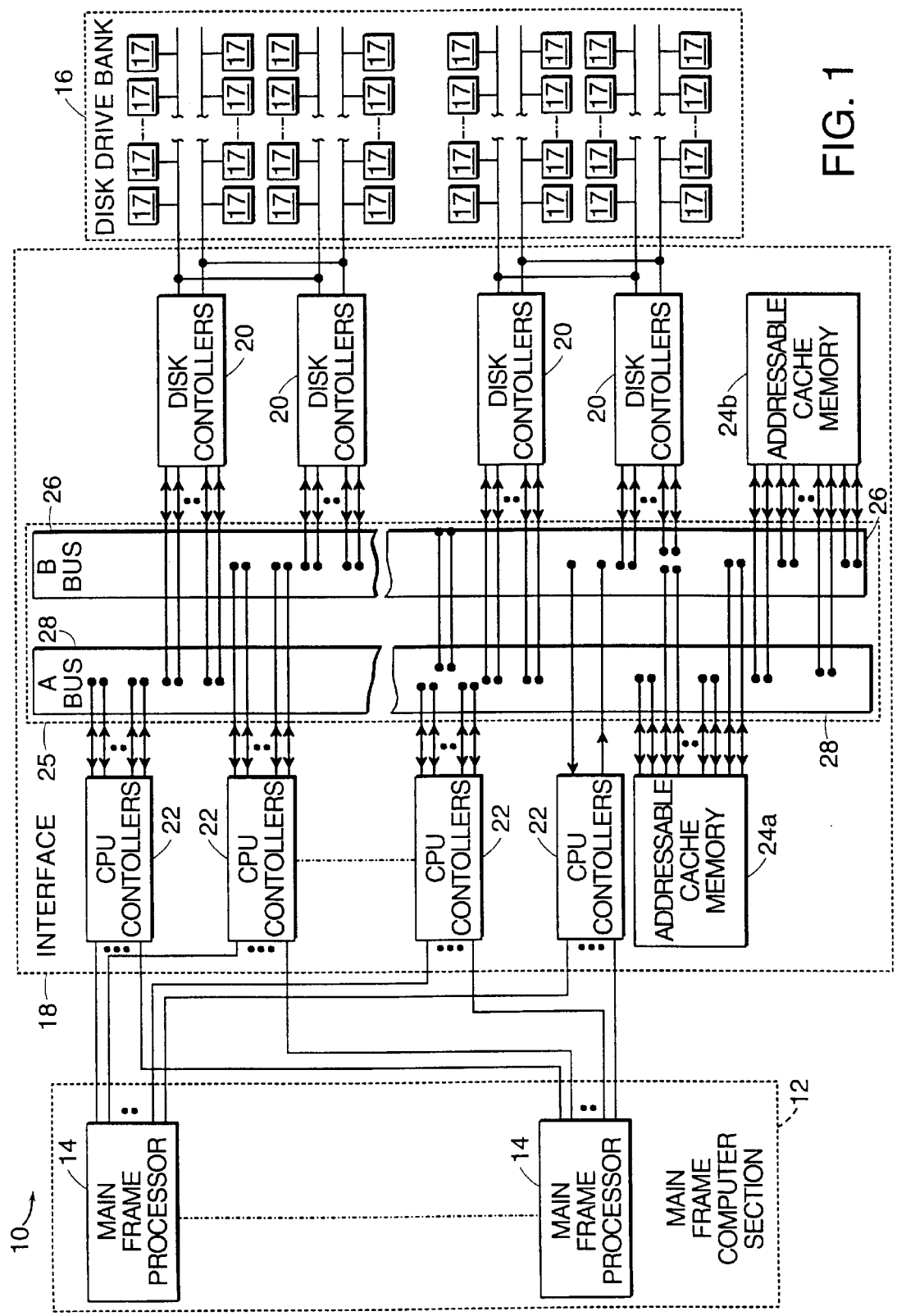
FIG. 1 is a block diagram of a computer system using a data storage system in accordance with the invention.

Referring now to FIG. 1, a computer system 10 is shown. The computer system 10 includes a main frame computer section 12 having main frame processors 14 for processing data. Portions of the processed data are stored in, and retrieved data from, a bank 16 of disk drives 17 through an interface 18.

The interface 18 includes disk controllers 20, central processor unit (CPU) controllers 22 and addressable cache memories 24a, 24b electrically interconnected through a bus 25, here a pair buses; i.e., an A bus 28 and a B bus 26. The cache memories 24a, 24b are hereinafter sometimes referred to only as addressable memories.

More particularly, in order to provide data integrity in case of a failure in a disk controller 20 or CPU controller 22, the pair of buses 26, 28 is provided. One portion of the disk controllers 20 is connected to one of the buses 26, 28 and the other portion of the disk controllers 20 is connected to the other one of the buses 26, 28. Likewise, one portion of the CPU controllers 22 is connected to one of the buses 26, 28 and the other portion of the CPU controllers 22 is connected to the other one of the buses 26, 28. The cache memories 24a, 24b are connected to both buses 26, 28, as shown.

Figure 2:
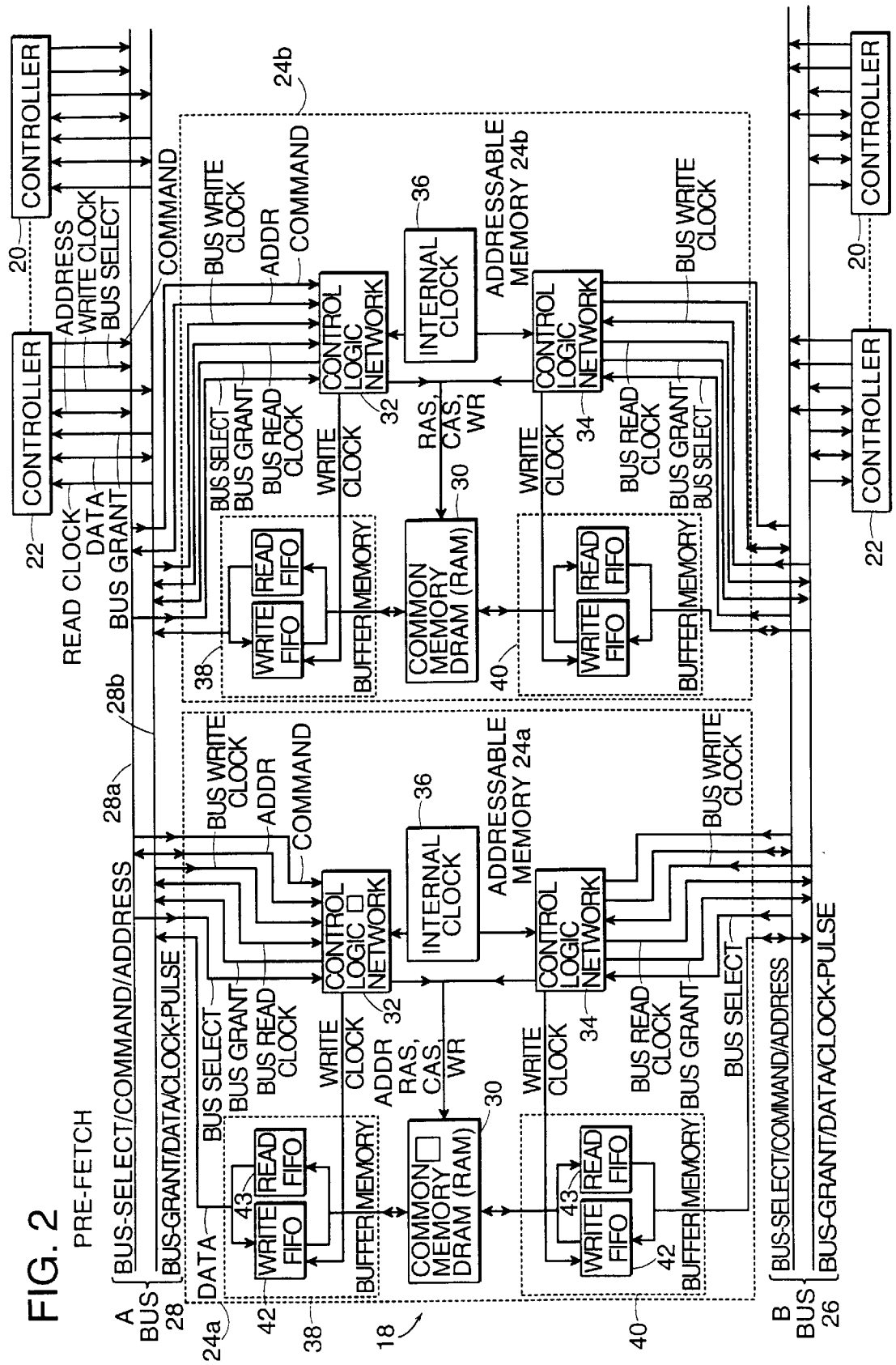
FIG. 2 is a block diagram of an interface used in the data storage system of FIG. 1, such interface providing coupling between main frame computer processors and a bank of disk storage devices according to the invention.

Referring now to FIG. 2, the interface 18, and more particularly, the addressable cache memories 24a, 24b thereof, is shown in detail. While the addressable memories 24a, 24b have different address, they are otherwise substantially identical, as indicated in FIG. 2. Thus, each one of the addressable memories 24a, 24b includes: a random access memory (RAM) 30, here a dynamic random access memory (DRAM) adapted for coupling to bus 26 or bus 28 in response to row address select (RAS), column address select (CAS) write enable (W) and read enable (R) signals fed thereto; a pair of control logic networks 32, 34; internal clock 36; and a pair of buffer memories 38, 40, all arranged as shown. It is first noted that while the DRAM 30 is common to both buses 26, 28, control logic network 32 and buffer memory 38 are associated with bus 28 and control logic network 34 and buffer memory 40 are associated with bus 26. A token arbitration system, not shown, is provided for controlling sharing of the pair of buses 26, 28 by the common DRAM 30. One such bus arbitration system is described in co-pending patent application Ser. No. 08/534, 376, "Bus Arbitration System, inventor Eli Leshem, filed Sep. 28, 1995, assigned to the same assignee as the present invention, the contents thereof being incorporated herein by reference.

Each one of the buffer memories 38, 40 includes a write first-in/first-out memory (FIFO) 42 and a read FIFO 43. The write FIFO 42 of buffer memory 38 is adapted to have data written therein from the bus 28 in response to a write clock produced by the control logic network 32; such write clock being produced by network 32 in response to a bus write clock produced by a controller 20, 22 on the bus 28 in a manner to be described in connection with FIGS. 3A through 3H. Data stored in the DRAM 30 is supplied to bus 28 either indirectly through the read FIFO 43 of the buffer memory 38, or directly via a by-pass, not shown. In like manner, the write FIFO 42 of buffer memory 40 is adapted to have data written therein from the bus 26 in response to a write clock produced by the control logic network 34; such write clock being produced by network 34 in response to a bus write clock produced by a controller 20, 22 on the bus 26 in a manner equivalent to that to be described in connection with FIGS. 3A through 3H. Data stored in the DRAM 30 is supplied to bus 26 either indirectly through the read FIFO 43 of the buffer memory 40, or directly via a by-pass, not shown. It is noted that, while the internal transfer of data among the buffer memory 40, DRAM 30 and bus 26 is controlled by control logic network 34, both control logic networks 32, 34 are synchronized with respect to each other by the internal clock 36.

More particularly, the basic read/write bus protocol will be described with reference to FIGS. 3A through 3H, it being understood the read/write protocol for A Bus 28 is the same as the bus protocol for B bus 26. Bus arbitration for the shared DRAM 30 is performed by the bus arbitration system described in the above referenced patent application. Thus, considering A bus 28 and recognizing that B bus 26 operates in the equivalent manner, it is first noted that bus 28, like bus 26, has an bus-select/address/command portion 28a and a bus-grant/data/clock-pulse portion 28b, as shown in FIG. 2. Each one of the controllers 20, 22 is adapted: (a) to assert on the bus-select/command/address portion 28a of the bus 28 during a controller initiated bus assert interval ("BUS ASSERT", FIG. 3A), a command on bus portion 28a (FIG. 3B), such command including: (i) either a write operation request or a read operation request; and (ii) an address for the one of the addressable memories 24a, 24b selected by the controller 20, 22 to respond to the write operation or read operation command; and (b) to produce data (FIG. 3E) and bus write clock pulses (FIG. 3F) on the bus-grant/data/clock-pulse portion 28b of the bus 28 when a write operation is requested during a subsequent bus grant interval (FIG. 3C) produced by the addressed one of the memories 24a, 24b.

Figure 3:
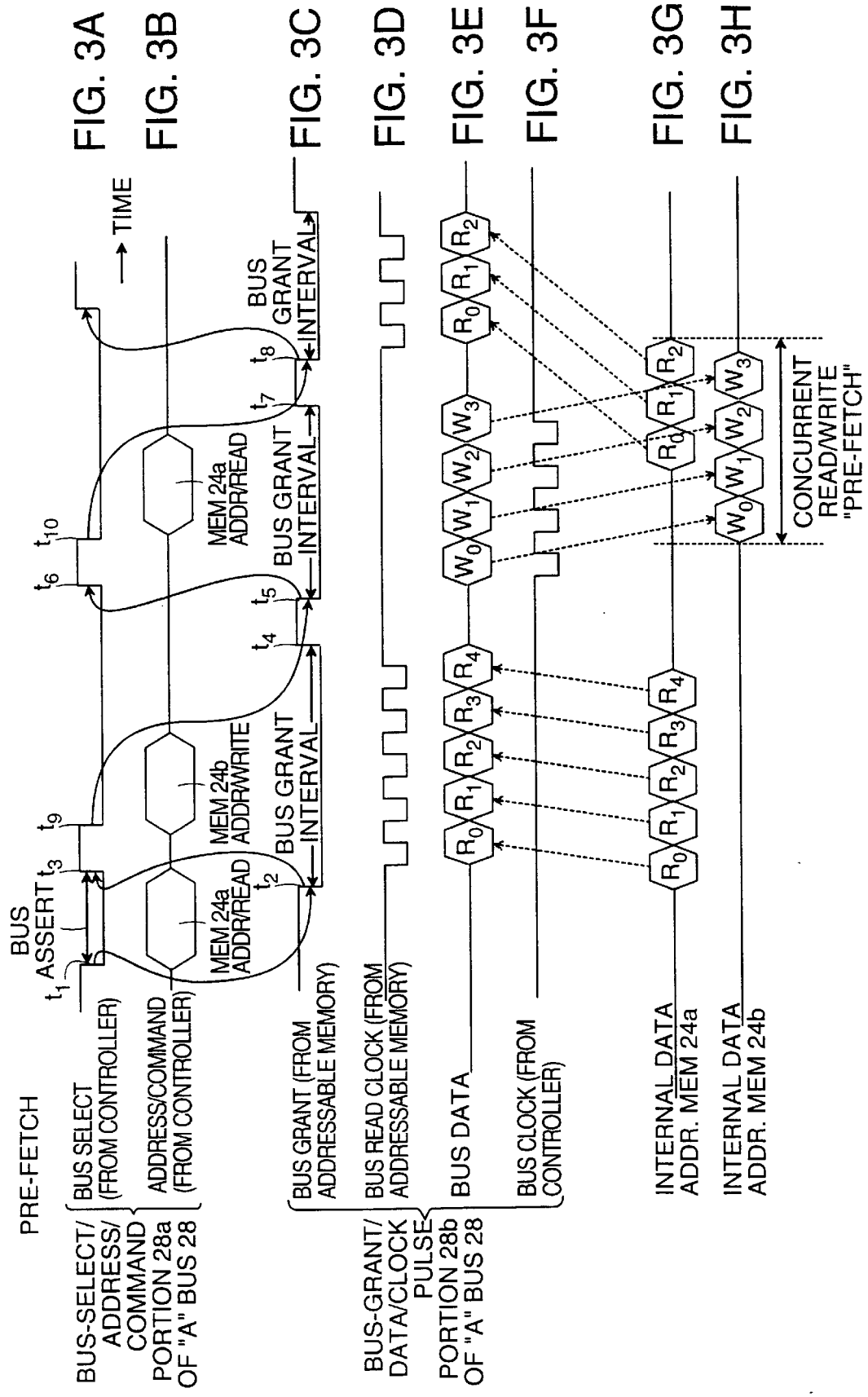
FIGS. 3A through 3H are timing diagrams useful in understanding the operation of the data storage system interface of FIG. 2.

Each addressed one of the addressable cache memories 24a, 24b is adapted: (a) to produce on the bus-grant/data/clock-pulse portion 28b of the bus 28, a bus grant signal (FIG. 3C) to initiate the bus grant interval when the addressed one of the memories 24a, 24b is available to respond to the read or write operation request by the controller 20, 22 (FIG. 3B); (b) to provide on the bus-grant/data/clock-pulse portion 28b of the bus 28 during the bus grant interval in response to the read operation request by the controller 20, 22: (i) data at the address provided by the controller 20, 22 during the bus assert interval (FIGS. 3A, 3F); and (ii) bus read clock pulses (FIG. 3D); (c) to write, in response to the write operation request by the controller 20, 22 during the bus grant interval, the data on the bus-grant/data/clock-pulse portion 28b of the bus 28 into the addressed one of the memories 24a, 24b in response the bus write clock pulses produced by the controller 20, 22 on the bus-grant/data/clock-pulse portion 28b of the bus 28; and, (d) to remove the bus grant signal (FIG. 3C) from the bus-grant/ data/clock-pulse portion 28b of the bus 28 upon completion of the read or write operation requested by the controller 20, 22 terminating the bus grant interval (FIG. 3C). Each one of the controllers 20, 22 is adapted to provide on the bus-select/address/command portion 28a of the bus 28 another address and command after termination of a previous bus assertion interval.

The control logic networks 32, 34 are configured to enable data on the bus 28, 26, respectively, to be written into the random access memory 50 of one of the addressed one of the memories 24a, 24b (here, for example, memory 24a) in response to clock pulses produced on the bus 28, 26, respectively during a period of time when data stored in the random access memory 50 of another one of the addressable memories 24a, 24b (here, in this example, memory 24b) is transferred to the buffer memory 38, 40, respectively, thereof in response to clock signals produced by the internal clock 36 thereof. With this arrangement, data to be read from the other one of the addressable memories (here, in this example, memory 24b) can be pre-fetched from the random access memory 50 thereof while data is written into the first-mentioned addressable memory (here, memory 24a).

Thus, referring to FIGS. 3A through 3H, and considering bus 28, at time $t_1$ a controller 20, 22 asserts the bus 28 by changing the level of the signal on the bus-select/address/command portion 28a of the bus 28 from a "high" to a "low", FIG. 3A. Next, one of the addressable memories 24a, 24b, here memory 24a is addressed, and a read command is requested by the controller 20, 22 on the bus-select/address/command portion 28a of the bus 28.

At time $t_2$, the addressed memory 24a is granted the bus 28 and such memory 24a changes the level on the bus-grant/data/clock-pulse portion 28b of the bus 28 from a "high" to a "low", FIG. 3C. It is noted that once the memory grant has been placed on the bus-grant/data/clock-pulse portion 28a of the bus 28, a new bus select command may be issued by a controller 20, 22 even during a bus grant interval. In this example, a new bus select is issued at time $t_9$ during the bus grant interval.

In this example, because a read was commanded by the controller 20, 22, data in the DRAM 30 is transferred under control of the internal clock 36 to the buffer memory 38, FIG. 3G. Next, the data is read from the buffer memory 38 in response to the internal clock 36 and transferred to the bus-grant/data/clock-pulse portion 28b of the bus 28 (FIG. 3E) along with bus read clock pulses produced by memory 24a (FIG. 3D). It is noted that the data read from the DRAM 30 may be transferred directly to the bus-grant/data/clock-pulse portion 28b of the bus 28 without going through the buffer memory 30 via a by-pass, not shown.

As noted above, at time $t_9$ a second controller select was asserted. Here, the controller 20, 22 requests that memory 24b write data on the bus 28. Once memory 24a has completed its task, it de-asserts the bus grant at time $t_4$. Now, the memory 24a is able to assert the bus 28 and, in this example, issues a bus grant signal at time $t_5$. Data provided on the bus 28 (FIG. 3E) by the controller 20, 22 (along with clock pulses (FIG. 3F)) is stored in the buffer memory 38 of memory 24b, as shown in FIG. 3H.

It is noted that, at time $t_{10}$ a controller 20, 22 asserts the bus 28. Here, the asserting controller 20, 22 requests that data be read from memory 24a. Memory 24a is able to receive the request and, while memory 24a is not able to transfer the requested data therein to the bus-grant/data/clock-pulse portion 28b of the bus 28 because such bus has the data to be written into the memory 24b, data in the DRAM 30 of memory 24a can be read therefrom (i.e. pre-fetched) into the buffer memory 38 thereof. This pre-fetched data stored in the buffer 38 is then placed on the bus 28 at time $t_8$ after the memory 24b has released the bus 28 at time $t_7$. This, pre-fetching process frees the DRAM 30 for other requests, for example requests from B bus 26 which may occur as data is transferred from the buffer memory 38 to A bus 28.

Figure 4:
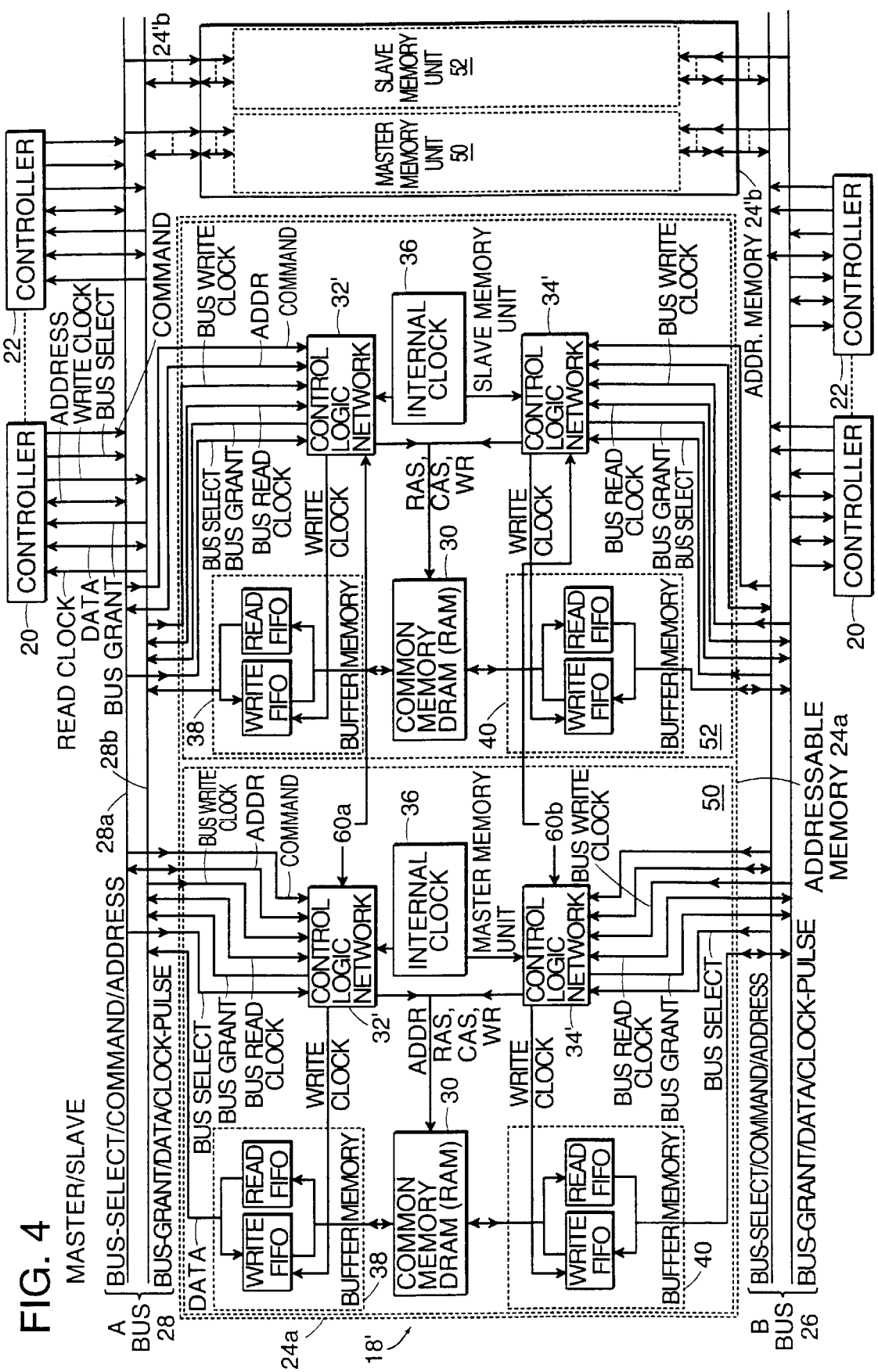
FIG. 4 is a block diagram of another interface adapted for use in the data storage system of FIG. 1, such interface providing coupling between main frame computer processors and a bank of disk storage devices according to the invention.

Referring now to FIG. 4, another interface 18' is shown adapted for use in the data storage system 10 shown in FIG. 1. The interface 18' uses the basic protocol described above in connection with FIGS. 3A through 3D. Here, each one of the addressable cache memories 24'a, 24'b includes a master memory unit 50 and a slave memory unit 52. Each one of the memory units 50, 52 has the same address as the addressable memory 24a, 24b thereof. Thus, the master memory unit 50 and slave memory unit 52 included in the addressable memory 24a each have the same address as the addressable memory 24a. Likewise, the master memory unit 50 and slave memory unit 52 included in the addressable memory 24b each have the same address as the addressable memory 24b.

Each master memory unit 50 and slave memory unit 52 includes: (1) a pair of buffer memories 38, 40 coupled to the bus 28, 26, respectively, as shown; (2) a random access memory 30 coupled to the pair of buffer memories 38, 40, as shown; (3) an internal clock 36; and, (4) a pair of control logic networks 32',34' coupled to the buses 28, 26, respectively, as shown, and configured to transfer data among the buffer memory 38, 40, respectively coupled thereto, the random access memory 30 and the bus 28, 26, respectively coupled thereto, as shown, in response to clock signals produced by the internal clock 36 and clock pulses provided on the bus 28, 26, respectively coupled thereto. As with the memory 24a, 24b described in connection with FIG. 2, it is again noted that while the DRAM 30 is common to both buses 26, 28, control logic network 32' and buffer memory 38 are associated with bus 28 and control logic network 34' and buffer memory 40 are associated with bus 26. A token arbitration system, not shown, is provided for controlling sharing of the pair of buses 26, 28 by the common DRAM 30 is described in the above-referenced copending patent application Ser. No. 08/534,376.

As with the memories 24a, 24b described above in connection with FIG. 2, each one of the buffer memories 38, 40 includes a write first-in/first-out memory (FIFO) 42 and a read FIFO 43. The write FIFO 42 of buffer memory 38 is adapted to have data written therein from the bus 28 in response to a write clock produced by the control logic network 32'; such write clock being produced by network 32' in response to a bus write clock produced by a controller 20, 22 on the bus 28 in a manner to be described in connection with FIGS. 5A through 5H. Data stored in the DRAM 30 is supplied to bus 28 either indirectly through the read FIFO 43 of the buffer memory 38, or directly via a by-pass, not shown. In like manner, the write FIFO 42 of buffer memory 40 is adapted to have data written therein from the bus 26 in response to a write clock produced by the control logic network 34'; such write clock being produced by network 34' in response to a bus write clock produced by a controller 20, 22 on the bus 26 in a manner equivalent to that to be described in connection with FIGS. 5A through 5H. Data stored in the DRAM 30 is supplied to bus 26 either indirectly through the read FIFO 43 of the buffer memory 38, or directly via a by-pass, not shown. It is noted that, while the internal transfer of data among the buffer memory 38, DRAM 30 and bus 28 is controlled by control logic network 32', both control logic networks 32', 34' are synchronized with respect to each other by the internal clock 36. It is noted that control logic network 32' of the master memory unit 50 and the slave memory unit 52 are hereinafter sometimes jointly referred to as control unit 60a. Likewise, control logic network 34' of the master memory unit 50 and the slave memory unit 52 are hereinafter sometimes jointly referred to as control unit 60b.

Referring now to FIG. 5A through 5H, and considering the operation of bus 28, it being understood that bus 26 operates in an equivalent manner, the pair of logic networks in each one of the addressable cache memories 24a, 24b provide a control unit 60a therefor. Each addressable memory 24a, 24b control unit 60a, 60b, respectively, is configured to produce control signals to enable data stored in the master memory unit 50 thereof to be read therefrom and transferred to the bus 28, 26, respectively, when such data is requested from the addressable memory 24a, 24b and to enable data on the bus 28, 26 to be written into both the master memory unit 50 and the slave memory unit 52 when data on the bus 28, 26, respectively, is to be written into the addressable memory 24a, 24b.

More particularly, each control unit 60a, 60b is configured to produce control signals to control data transfer between the random access memory 30 and the bus-grant/data/clock-pulse portion 28b, 26b, respectively, of the bus 28, 26, respectively, as follows: (a) to enable data stored in the random access memory 30 of the master memory unit 50 to be read therefrom and transferred to the bus-grant/data/clock-pulse portion of the bus 28b, 26b, respectively, along with the produced bus read clock pulses when such data is requested by the controller 20, 22 from the addressable memory 24a, 24b; and, (b) to enable data on the bus-grant/data/clock-pulse portion 28b, 26b, of the bus 28, 26 to be written concurrently into the random access memory 30 of both the master memory unit 50 and the slave memory unit 52 (since both the master memory unit 50 and the slave memory unit 52 have the same address as the addressable memory which includes such memory units 50, 52) in response to the write clock pulses produced on the bus-grant/data/clock-pulse portion 28b, 26b, respectively, of the bus 26 by the controller 20, 22, when the controller 20, 22 requests data on the bus-grant/data/clock-pulse portion 28b, 26b, respectively, of the bus 28, 26, respectively, be written into the at least one addressable memory 24a, 24b. With such an arrangement, each addressable memory 24a, 24b has redundancy and is operable in case either the master memory unit 50 or the slave memory unit 52 fails.

Figure 5:
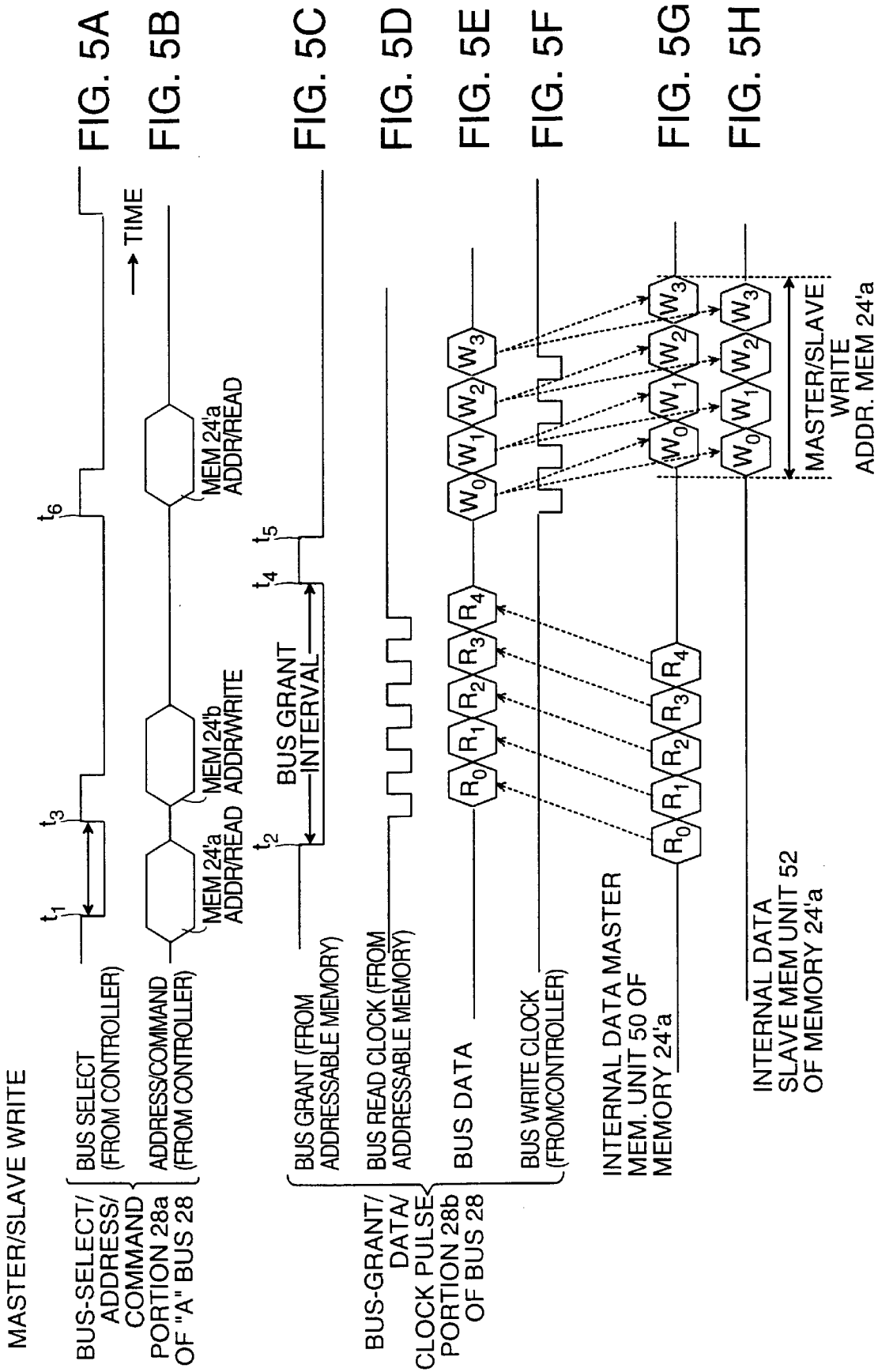
FIGS. 5A through 5H are timing diagrams useful in understanding the operation of the data storage system interface of FIG. 4 during a normal operating mode.

More particularly, referring to FIGS. 5A through 5H, it is first noted that here the controller 20, 22 produces the same requests as described above in connection with FIGS. 3A and 3B. Here, however, while data in only the master memory unit 50 is read during the bus grant interval (FIGS., 5C, 5D, 5E and 5F), at time $t_2$, data on the bus 28 is written concurrently at time $t_5$ into both the master memory unit 50 and the slave memory unit 52 (FIGS., 5G and 5H; more particularly, into the buffer memories 38 of both the master memory unit 50 and the slave memory unit 52) in response to controller 20, 22 produced write clock pulses (FIG. 5F). Thus, in the event that the control logic unit 32' fails in either the master memory unit 50 or the slave memory unit 52, the data is stored in the other one of the memory units 52, 50, respectively.

Referring again to FIG. 4, the control unit 60a, 60b is adapted to: (i) during a normal mode, enable data produced on the bus 28, 26 to be written into both the master memory unit 50 and the slave memory unit 52 and data in only the master memory unit 50 to be read therefrom when such data is to be transferred to the bus 28, 26, and (ii) during a read/copy mode, enable data stored in the master memory unit 50 to be read therefrom, transferred to the bus 28, 26, and written from the bus 28, 26 into the slave memory unit 52.

With such an arrangement, data in the master memory unit 50 may be copied to the slave memory unit 52 after a failed slave memory unit 52, for example, has been replaced without disrupting the operation of the system 10.

Figure 6:
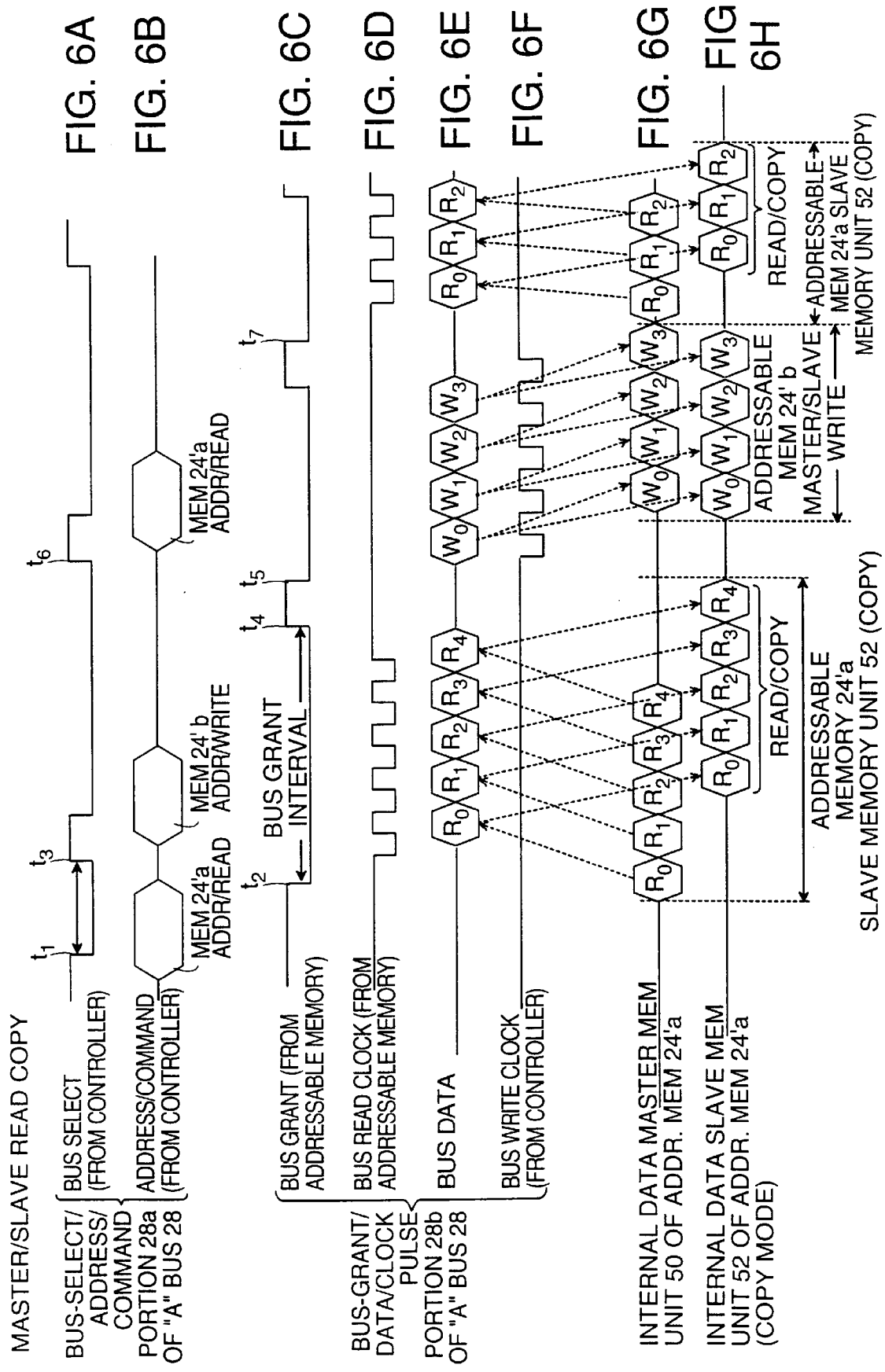
FIGS. 6A through 6H are timing diagrams useful in understanding the operation of the data storage system interface of FIG. 4 during a copy operating mode.

Thus, referring to FIGS. 6A through 6H, it is first noted that here the controller 20, 22 produces the same requests (FIGS. 6A and 6B) as described above in connection with FIGS. 3A and 3B. After the defective master memory unit 50, or slave memory unit 52, as the case may be, is replaced, the new mater or slave unit control logic network 32' or 34' is placed in the read/copy mode. Let it be assumed in this example that the slave unit 52 was replaced. Thus, at time $t_1$, a controller 20, 22 asserts here bus 28 and requests that memory 24'a read data on the bus 28. At time $t_2$ the addressed memory 24'a is granted bus 28, FIG. 6C. The addressed memory 24a produces bus read clock pulses. FIG. 6D. Data is transferred internally in the master memory unit 50 of the addressed memory 24'a (FIG. 6G) from the DRAM 30 to the data portion 28b of bus 28 (FIG. 6E). When data is to be written into an addressed memory 24a, 24b, for example into memory 24b, during the time memory 24b is granted the bus 28, at time $t_5$, the data on the data portion 28b of the bus (FIG. 6E) is written into both the master memory unit 50 and the slave memory unit 52, since both memory units 50, 52 have the same address as the memory 24a, as shown in FIGS. 6E, 6G and 6H. Next, a controller 20, 22 requests, for example, that memory 24a read data on the data portion 28b of the bus 28. Thus, during the next bus grant interval, here at time $t_7$, data is read internally in the master memory unit 50 of the addressed memory 24a (FIG. 6G) and such read data is transferred to the data portion 28b of bus 28 (FIG. 6E). Also, the data placed on the data portion 28a of the bus 28 is also copied into the buffer memory 38 of the slave memory unit 52 of the addressed memory 24a, as shown in FIG. 6H. Thus, data in the master memory unit 50 is copied to the slave memory unit 52 during the read/copy mode without disrupting the operation of the system 10 after a failed slave memory unit 52, for example, has been replaced. To put it another way, the control unit 60a, 60b provides control signals to enable: (a) during a normal mode, data produced on the bus 28, 26, respectively, to be written into both the master memory unit 50 and the slave memory unit 52 in response to bus write clock pulses and data in only the master memory unit 50 to be read therefrom when such data is to be transferred to the bus 28, 26; and (b) during a read/copy mode, data stored in the master memory unit 50 to read therefrom, transferred to the bus 28, 26, and written from the bus 28, 26 into the slave memory unit 52.

Figure 7:
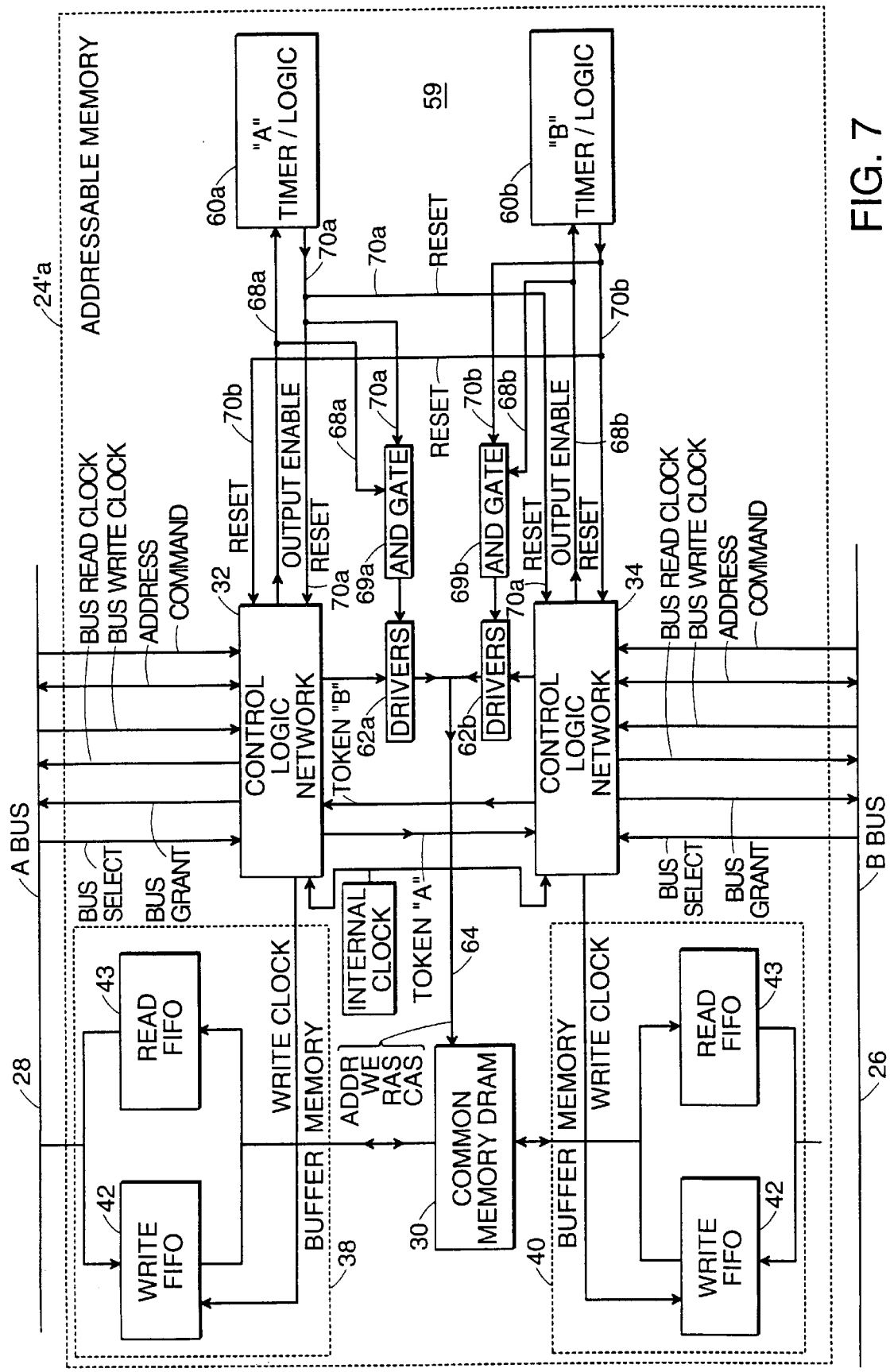
FIG. 7 is a block diagram showing a failure monitoring system according to the invention adapted for use with addressable memories adapted for use with the system shown in FIG. 1.

Referring now to FIG. 7, an addressable memory 24'a adapted for use in system 10 (FIG. 1) as either the addressable memory 24a shown in FIG. 2, or as a master memory unit 50 and/or slave memory unit 52 (FIG. 4) is shown. Elements in addressable memory 24'a equivalent to those in memory 24a have the same numerical designation. Here, addressable memory 24'a includes, additionally, a failure monitoring system 59; more particularly, a pair of timer/logic units 60a, 60b. The timer/logic units 60a, 60b are provided to test whether the control signals produced by the control logic networks 32, 34 are being produced properly. More particularly, if there is a data transfer on the A bus 28, for example, the A bus 28 acquires the DRAM 30 and control logic network 32 produces an output enable signal, which is monitored on line 68a, that allows A bus 28 to access the common DRAM 30. In like manner, if there is a data transfer on the B bus 26, for example, the B bus 26 acquires the DRAM 30 and control logic network 34 produces an output enable signal, which is monitored on line 68b, that allows B bus 26 to access the common DRAM 30. Thus, an active output enable signal produced by control logic network 32, monitored on line 68a by the timer/logic unit 60a, indicates that the A bus 28 has access to the DRAM 30 and an active output enable signal produced by control logic network 34, monitored on line 68b by the timer/logic unit 60b, indicates that the B bus 26 has access to the DRAM 30.

It is first noted that, during normal operation, a token "A" or token "B" signal is passed between the control logic unit 32 and control logic unit 34 as described in the above reference patent application Ser. No. 08/534,376. Here, the timer/logic unit 60a measures the time duration which the output enable signal is produced by control unit network 32. In like manner, the timer/logic unit 60b measures the time duration which the output enable signal is produced by control unit network 34. Further, AND gates 69a, 69b are provided, the output of AND gate 69a being fed to an enable input of driver 62a and the output of AND gate 69b being fed to the enable input of driver 62b, as shown. The output enable signal produced by logic unit 32 on line 68a is fed as one input to the AND gate 69a and the output enable signal produced by logic unit 34 on line 68b is fed as one input to the AND gate 62b. If the output enable signal produced by control logic network 32 has been asserted for less than a predetermined maximum assertion time, here 10 microsecond, the AND gate 69a enables the driver 62a to pass the address signals from the control logic network 32 to the memory 30. In like manner, if the output enable signal produced by control logic network 34 has been asserted for less than a predetermined maximum assertion time, here 10 microsecond, the AND gate 69b enables the driver 62b to pass the address signals from the control logic network 34 to the memory 30.

On the other hand, if the output enable signal produced by control logic network 34 has been asserted for more than a predetermined maximum assertion time, here 10 microsecond, (i.e, the control logic network 32 is "stuck" in an DRAM/A bus 28 assert condition) the system 10 assumes a failure has occurred in the control logic network 32. The AND gate 69a disables the driver 62a and inhibits the driver 62a from passing the address signals from the control logic network 32 to the memory 30. Further, the timer/logic unit 60a produces a reset signal on line 70a to reset the control logic network 32 and thereby advise the token, bus arbitration system that controller 32 no longer has the token. The reset signal is also fed to the control logic network 34 to advise it that there is no need for it to wait for a token from control logic unit 32. Thus, the DRAM 30 is enabled to be granted B bus 26 even if the bus arbitration system, not shown and referred to above, has not passed control to (i.e., a "token" to) such control logic network 34. In order to account for a transient error in the control logic network 32, the timer/logic unit counts the number of times-a failure has occurred (i.e., the number of times within a predetermined period of time that the control logic network 32 is "stuck") and if less than a predetermined number of times in the predetermined period of time, the timer/logic unit 60a merely resets the control logic network 32 and not removed it from operation. Only when the control logic network 32 gets "stuck" more than the predetermined number of times within the predetermined period of time will the timer/logic unit 60a permanently disable the control logic network 32 so that the DRAM will not be allowed access to the A bus 28. In this case the control logic unit 32 must be replaced from the system 10.

In like manner, if the output enable signal produced by control logic network 34 has been asserted for more than the predetermined maximum assertion time, here 10 microsecond, (i.e, the control logic network 34 is "stuck" in the assert condition) and the timer/logic unit 60b will: (a) via AND gate 69b disable the address driver 62b; and (b) reset the output assert signal in control logic network 32 thereby enabling the DRAM 30 to be granted A bus 28 even if the bus arbitration system, not shown, has not passed a "token" to such control logic network 32. In order to account for a transient error in the control logic network 34, the timer/logic unit 60b counts the number of times a failure has occurred and if less than a predetermined number of times in the predetermined period of time, the timer/logic unit 60b merely resets the control logic network 34 and does not removed it from operation. Only when the control logic network 34 gets "stuck" more than the predetermined number of times within the predetermined period of time will the timer/logic unit 60b permanently disable the control logic network 34 so that the DRAM will not be allowed access to the B bus 26. In this case the control logic unit 34 must be replaced from the system 10.

Figure 8:
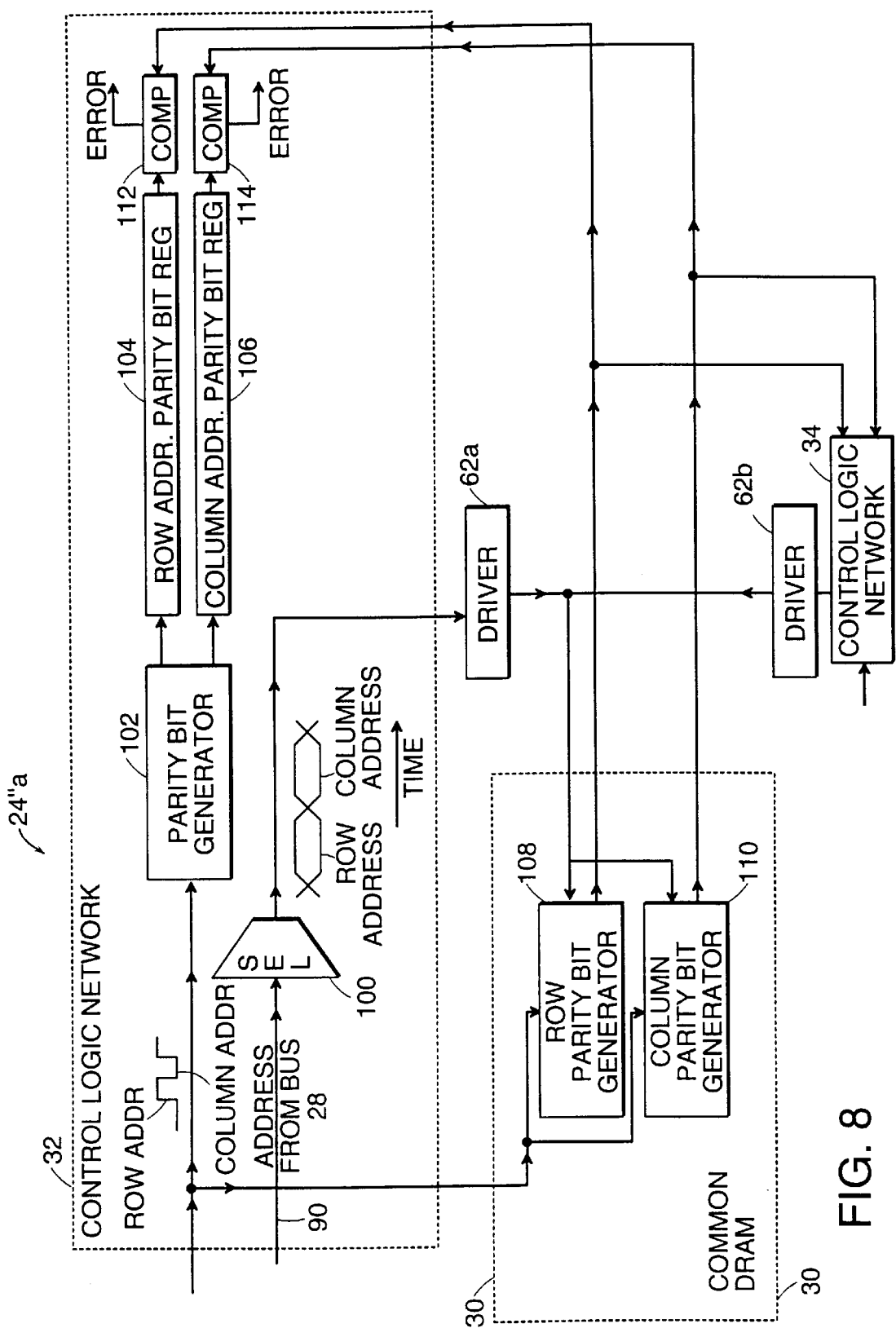
FIG. 8 is a block diagram showing an address parity bit checking system according to the invention adapted for use with addressable memories adapted for use with the system shown in FIG. 1.

Referring now to FIG. 8, an addressable memory 24"a adapted for use in system 10 (FIG. 1) as either the addressable memory 24a shown in FIG. 2, or as a master memory unit 50 and/or slave memory unit 52 (FIG. 4) is shown. Elements in addressable memory 24"a equivalent to those in memory 24a have the same numerical designation. Here, addressable memory 24"a includes, additionally, a system for determining whether there is a fault in the transmission of the address to the random access memory 30 via the address driver 62a or 62b. More particularly, the control logic networks 32, 34 and the random access memory 30 include parity checking circuitry to be described. It is noted that while the details of the parity checking circuity are shown and will be described for control logic network 32, it should be understood that control logic network 34 has the equivalent parity checking circuit and operates in the equivalent manner.

Thus, control logic network 32 receives the full, parallel address on A bus 28. That is, the address on bus 28 includes both the row address portion and the column address portion for the random access memory 30 in parallel. The full, parallel address on bus 28 is fed to a selector 100. Also fed to the selector 100 is a control signal for separating the full, parallel address fed to the selector 100 into a sequence of a row address signal portion and a column address signal portion for the random access memory unit, along with the row address select (RAS) and column address select (CAS) signals, in a conventional manner. Here, however, the control logic network 32 includes a parity bit generator 102 fed by the output of the selector 100 and the control signal for such selector 100 for generating a row parity bit from the row address signal portion of the address on bus 28 and a column parity bit from the column address signal portion of the address on bus 28. The generated row address parity bit is stored in row address parity bit register 104 and the generated column parity bit is stored in column register 106.

The address driver 62a feeds the sequence of the row address signal and the column address signal produced by the control logic network 32 to the random access memory 30. The random access memory 30 includes a row parity bit generator 108 for producing a parity bit from the row address fed thereto by the address driver 62a and a column parity bit generator 110 for producing a parity bit from the column address fed thereto by the address driver 62a. The row and column parity bits produced by the generators 108, 110 are fed to the control logic network 32 and compared with the row and column parity bits, respectively, generated by the control logic network 32 in comparators 112, 114, respectively. If-the row parity bit generated by the control logic network 32 is different from the row parity bit generated by the random access memory 30 or if the column parity bit generated by the control logic network 23 is different from the column parity bit generated by the random access memory 32, a fault in the transmission of the address to the random access memory 30 via the address driver 62a is detected.

Other embodiments are within the spirit and scope of the appended claims.

What is claimed is:

1. A data storage system wherein a computer having processors for processing data is coupled to a bank of disk drives through an interface, such interface comprising:
(A) a bus;
(B) a plurality of controllers each one thereof being adapted to assert on the bus during a controller initiated bus assert interval: (a) a memory address; aid (b) a command, such command including: (i) either a write operation request or a read operation request; and, (ii) when a write operation is requested during a subsequent bus grant interval, data and bus write clock pulses;
(C) at least one addressable memory adapted to produce on the bus a bus grant signal to initiate the bus grant interval in response to the controller bus assertion when such addressed memory is available to respond to the read or write operation request provided by the controller, and:
  (a) in response to a read operation request by the controller, provide, during the bus grant interval, data at the address provided by the controller during the bus assert interval along with bus read clock pulges;
  (b) in response to a write operation request by the controller, write, during the bus grant interval, the data on the bus at the address provided by the controller during the bus assert interval, such data being written into the addressable memory in response the bus write clock pulses produced by the controller on the bus during the bus grant interval; and,
  (c) upon completion of the read or write operation requested by the controller, remove the bus grant signal to terminate the bus grant interval; and
(D) wherein each one of the controllers is adapted to provide on the bus another address and command after termnination of a previous bus assertion interval.

2. The system recited in claim 1 wherein the at least one addressable memory, comprises:
(a) a master memory unit;
(b) a slave memory unit;
(c) wherein the master memory unit and the slave memory unit have the same address as the addressable memory;
(d) a control unit for producing control signals to enable data stored in the master memory unit to be read therefrom and transferred to the bus when such data is requested from the addressable memory and to enable data on the bus to be concurrently written into the master memory unit and the slave memory unit when data on the bus is to be written into the addressable memory.

3. The system recited in claim 1 wherein the at least one addressable memory comprises:
(a) a master memory unit;
(b) a slave memory unit;
(c) wherein the master unit and the slave unit have the same address as the addressable memory;
(d) a control unit for providing control signals to:
  (i) during a normal mode, enable data produced on the bus to be written into both the master memory unit and the slave memory unit in response to bus write clock pulses and data in only the master memory unit to be read therefrom when such data is to be transferred to the bus, and
  (ii) during a read/copy mode, enable data stored in the master memory unit to be read therefrom, transferred to the bus, and written from the bus into the slave memory unit.

4. The system recited in claim 1 including a plurality of the addressable memories, each one of such addressable memories comprising:
(a) a random access memory;
(b) an internal clock;
(c) a buffer memory; and
(d) a logic network configured to enable data on the bus to be written into the random access memory of one of the plurality of addressable memories in response to clock pulses produced on the bus during a period of time when data stored in the random access memory of another one of the addressable memories is transferred to the buffer memory thereof in response to clock signals produced by the internal clock.

5. A data storage system wherein a computer having processors for processing data is coupled to a bank of disk drives through an interface, such interface comprising:
(A) a bus having an bus-select/address/command portion and a bus-grant/data/clock-pulse portion;
(B) at least one addressable memory;
(C) a plurality of controllers each one thereof being adapted:
  (a) to assert on the bus-select/command/address portion of the bus during a controller initiated bus assert interval a command including: (i) either a write operation request or a read operation request; and (ii) an address to address one of the at least one addressable memory selected by the controller to respond to the write operation or read operation command; and
  (b) to produce data and bus write clock pulses on the bus-grant/data/clock-pulse portion of the bus when a write operation is requested during a subsequent bus grant interval produced by the addressed memory;
(D) such addressed memory being adapted:
  (a) to produce on the bus-grant/data/clock-pulse portion of the bus a bus grant signal to initiate the bus grant interval when the addressed memory is available to respond to the read or write operation request;
  (b) to provide on the bus-grant/data/clock-pulse portion of the bus during the bus grant interval in response to the read operation request by the controller: (i) data at the address provided by the controller during the bus assert interval; and (ii) bus read clock pulses;

(c) to write, in response to the write operation request by the controller during the bus grant interval, the data on the bus-grant/data/clock-pulse portion of the bus into the addressed memory in response the bus write clock pulses produced by the controller on the bus-grant/data/clock-pulse portion of the bus; and, (d) to remove the bus grant signal from the bus-grant/data/clock-pulse portion of the bus upon completion of the read or write operation requested by the controller terminating the bus grant interval; and (E) wherein each one of the controllers is adapted to provide on the bus-select/address/command portion of the bus another address and command after termination of a previous bus assertion interval.

6. The system recited in claim 5 wherein:
(A) the at least one addressable memory, comprises:
  (a) a master memory unit;
  (b) a slave memory unit; and
  (c) wherein the master memory unit and the slave memory unit have the same address as the addressable memory; and,
(B) the system includes:
  a control unit for producing control signals to enable data stored in the master memory unit to be read therefrom and transferred to the bus when such data is requested from the addressable memory and to enable data on the bus to be concurrently written into the master memory unit and the slave memory unit when data on the bus is to be written into the addressable memory.

7. The system recited in claim 5 wherein:
(A) the at least one addressable memory comprises:
  (a) a master memory unit;
  (b) a slave memory unit; and
  (c) wherein the master unit and the slave unit have the same address as the addressable memory; and
(B) the system includes: a control unit for providing control signals to enable:
  (a) during a normal mode, data produced on the bus to be written into both the master memory unit and the slave memory unit in response to bus write clock pulses and data in only the master memory unit to be read therefrom when such data is to be transferred to the bus, and
  (b) during a read/copy mode, data stored in the master memory unit to read therefrom, transferred to the bus, and written from the bus into the slave memory unit.

8. The system recited in claim 5 including a plurality of the addressable memories, each one of such addressable memories comprising:
  (a) a random access memory;
  (b) an internal clock;
  (c) a buffer memory; and
  (d) a logic network configured to enable data on the bus to be written into the random access memory of one of the plurality of addressable memories in response to clock pulses produced on the bus during a period of time when data stored in the random access memory of another one of the addressable memories is transferred to the buffer memory thereof in response to clock signals produced by the internal clock.

9. The system recited in claim 5 wherein:
(A) the at least one addressable memory, comprises:
  (a) a master memory unit;
  (b) a slave memory unit; and
  (c) wherein the master unit and the slave unit having the same address as the at least one addressable memory; and
  (d) the master memory unit and the slave memory unit each comprising:
    (i) a random access memory; and
    (ii) an internal clock; and
(B) wherein the system includes: a control unit for producing control signals to control data transfer between the random access memory and the bus-grant/data/clock-pulse portion of the bus, to enable:
  (a) data stored in the random access memory of the master memory unit to be read therefrom and transferred to the bus-grant/data/clock-pulse portion of the bus along with the bus read clock pulses when such data is requested by the controller from the addressable memory; and,
  (b) data on the bus-grant/data/clock-pulse portion of the bus to be written concurrently into the random access memory of both the master memory unit and the slave memory unit in response to the write clock pulses produced on the bus-grant/data/clock-pulse portion of the bus by the controller when the controller requests data on the bus-grant/data/clock-pulse portion of the bus be written into the at least one addressable memory.

10. The system recited in claim 9 wherein:
(A) each one of the addressable memories includes a buffer memory; and
(B) wherein the control unit is configured to enable:
  (a) data produced on the bus-grant/data/clock-pulse portion of the bus to be written into the buffer memory in response to the bus write clock pulses produced by the controller on the bus-grant/data/clock-pulse portion of the bus, and;
  (b) data stored in the buffer memory to be transferred between the buffer memory and the random access memory in response to clock signals produced by the internal clock.

* * * * *